United States Patent [19]

Ishigami et al.

[11] Patent Number: 5,584,906

[45] Date of Patent: Dec. 17, 1996

[54] HIGHLY PURIFIED TITANIUM MATERIAL, METHOD FOR PREPARATION OF IT AND SPUTTERING TARGET USING IT

[75] Inventors: Takashi Ishigami; Mituo Kawai; Noriaki Yagi, all of Yokohama, Japan

[73] Assignee: Kabushiki Kaisha Toshiba, Kawasaki, Japan

[21] Appl. No.: 28,084

[22] Filed: Mar. 8, 1993

Related U.S. Application Data

[62] Division of Ser. No. 924,770, Apr. 9, 1992, Pat. No. 5,204, 057, which is a continuation of Ser. No. 550,682, Jul. 10, 1990, abandoned.

[30] Foreign Application Priority Data

Jul. 14, 1989 [JP] Japan ..................... 1-181877

[51] Int. Cl.$^6$ ............................. C22B 34/12; C25C 3/28
[52] U.S. Cl. ................. 75/336; 75/345; 75/369; 75/10.26; 216/13; 205/398
[58] Field of Search ............... 75/10.18, 10.25, 75/10.26, 336, 345, 368, 369; 241/24; 156/664; 204/64 T; 205/398; 216/13

[56] References Cited

U.S. PATENT DOCUMENTS

| | | | |
|---|---|---|---|
| 3,137,641 | 6/1964 | Slatin | 204/64 T |
| 3,891,456 | 6/1975 | Hohman et al. | 156/664 |
| 4,218,410 | 8/1980 | Stephan et al. | 75/336 |
| 4,268,271 | 5/1981 | Curtin | 241/24 |
| 4,363,722 | 12/1982 | Dresty et al. | 241/24 |
| 4,381,976 | 5/1983 | Armand | 204/64 T |
| 4,470,847 | 9/1984 | Hard et al. | 75/360 |
| 4,551,434 | 11/1985 | Thoma | 156/664 |
| 4,678,506 | 7/1987 | Bania | 75/10.25 |
| 4,793,854 | 12/1988 | Shimotori et al. | 75/10.10 |
| 4,891,066 | 1/1990 | Shimotori et al. | 75/10.19 |
| 5,021,084 | 6/1991 | Bianchi | 75/10.25 |
| 5,336,378 | 8/1994 | Nishimura et al. | 204/64 T |

FOREIGN PATENT DOCUMENTS

| | | | |
|---|---|---|---|
| 0248338 | 12/1987 | European Pat. Off. | |
| 2623740 | 12/1976 | Germany | 204/64 T |

*Primary Examiner*—George Wyszomierski
*Attorney, Agent, or Firm*—Foley & Lardner

[57] ABSTRACT

The crude Ti particles prepared by molten salt electrolysis or Iodide method are classified into each particle diameter according to contents of impurities, and the crude Ti particles having a desired particle diameter are selected from the crude Ti particles classified depending on each particle diameter. Otherwise, the crude Ti particles are acid-treated. Then they are electron-beam-melted. Through the above production process, there is prepared a highly purified Ti material having an oxygen content of not more than 350 ppm, Fe, Ni and Cr contents of not more than 15 ppm each, Na and K contents of not more than 0.5 ppm each, a reduction of area as a material characteristic of not less than 70%, and a thermal conductivity of not less than 16 W/m K. In short, the highly purified Ti material satisfying high purity, good processability and good thermal conductivity can be obtained. A film having more uniform thickness of film and inside structure can be obtained from a sputtering target prepared using the above highly purified Ti material.

30 Claims, 3 Drawing Sheets

HIGHLY PURIFIED TITANIUM MATERIAL, METHOD FOR PREPARATION OF IT AND SPUTTERING TARGET USING IT

This application is a divisional of application Ser. No. 07/924,770, filed Apr. 9, 1992, now U.S. Pat. No. 5,204,051, a continuation of application Ser. No. 07/550,682 filed on Jul. 10, 1990, abandoned.

FIELD OF THE INVENTION AND RELATED ART STATEMENT

The present invention relates to highly purified titanium material suitable for target material used for forming Ti wiring network on a semiconductor device surface, a method for preparation of it, and a sputtering target using it.

Wiring network having a complicated pattern is formed on a surface of various kinds of semiconductor devices with conductive metallic materials according to a purpose of use. The wiring network is formed by forming a conductive metallic film made of Al, Au or the like by sputtering process and applying a certain etching treatment of the film for patterning.

Currently, the wiring is required to have a narrow width and a thin thickness as the semiconductor device is highly integrated. But high minute wiring network causes delay of signals due to the wiring resistance of used wiring material, or burn-out of wiring due to resistance heating during operation of the device because of using a material having a low melting point. Therefore wiring material not requiring a drastic alteration of any forming processes of LSI, VLSI, and ULSI, and having a high melting point is demanded. Ti attracts attention as one of the materials for that purpose, as well as Mo, W and Ta.

When Ti is used for wiring network of a semiconductor device, usually a film made of Ti is formed by sputtering process as described above. Therefore, a sputtering target made of Ti material is required to be prepared and the Ti target must have high purity. When the Ti target contains oxygen as an impurity, increased electric resistance of the film prepared causes a problem of delay or a problem of burn-out of wiring network. A heavy metal such as Fe, Ni or Cr makes a factor causing leakage at the joint of the film interface. An alkali metal such as Na or K readily sets Si free and degrades the characteristics of the device.

Besides the high purity mentioned above, the Ti target forming wiring network of, for example, VLSI is highly required to be uniform without any cracks or creases externally or internally, and to uniformly discharge the thermal energy produced during sputtering.

This is because the film thickness and the uniformity of inside composition of a film formed by sputtering, besides effects of an impurity, are becoming more important as high integration requires the wiring to be more minute. When scratches exist on the target surface or inside, flight of sputtering particles falls into disorder at that place, and the uniformity of bonding condition on a substrate is lowered, causing varying electric resistances or burn-out. When thermal energy applied to the target during sputtering is not uniformly discharged to the side of a backing plate, uniform bonding condition is deteriorated because of heterogeneity of temperature distribution of the target.

The above-mentioned Ti target is generally prepared by the method described below.

Crude Ti material is prepared by one of the following three methods. The first method is called the Kroll method or Hunter method which is to thermally reduce a Ti compound such as $TiCl_4$ with an active metal such as Na or Mg. The second is called the Iodide method which is to thermally decompose a titanium compound such as $TiI_4$. And third is a method for molten salt electrolysis in salt such as NaCl or KCl. Because the crude Ti material prepared as above is in the shape of sponge, crystal or a needle, it is generally arc-melted in a vacuum of about $10^{-2}$ Torr to $10^{-3}$ Torr to be made into an ingot, which is then shaped into a target form for use.

Because the purity of the Ti target prepared by the prior methods mentioned above is about 2N to 3N, it can be used as a sputtering target for 64 Kbits but not for 256 Kbits, 1 Mbit, 4 Mbits or higher because of low purity as a target material for wiring or barrier material.

Besides, the Ti target prepared by the prior methods is insufficient in view of the surface and inside conditions mentioned above. To prevent any surface or inside scratches of the Ti target from causing a change of electric resistance or burn-out, processability shall be raised. On the other hand, to prevent contamination during preparation, highly purified Ti is shaped into a certain form by cold working. The processability of the Ti material by the prior methods is not enough to achieve sufficient homogeneity. Besides, thermal energy is insufficiently discharged. In short, the prior methods do not provide a Ti material having high thermal conductivity sufficient to uniformly discharge the thermal energy which is applied to a target during sputtering, to the side of a backing plate.

SUMMARY OF THE INVENTION

An object of the present invention is to provide a highly purified Ti material having sufficient purity, processability and thermal conductivity required for a Ti target when forming a wiring layer or a barrier layer of LSI by sputtering process.

Another object of the present invention is to provide a method for preparing a highly purified Ti material capable of preparing a highly purified Ti material having high purity, excellent processability and thermal conductivity required for a Ti target when forming a wiring layer or a barrier layer of LSI by sputtering process.

And a further object of the present invention is to provide a sputtering target capable of forming a uniform Ti film including only a few impurities which have an adverse effect on the function of a device.

The highly purified Ti material of the present invention has an oxygen content of not more than 350 ppm, Fe, Ni and Cr contents of not more than 15 ppm each, Na and K contents of not more than 0.5 ppm each, a reduction of area as a material characteristic of not less than 70%, and a thermal conductivity of not less than 16 W/m K. Besides, a sputtering target of the present invention is made by shaping the above highly purified Ti material into a desired form.

First method of preparation of the highly purified Ti material of the present invention consists of a step of sieving crude Ti particles to classify them into each type of particle diameters according to contents of impurities, a step of sorting them having the desired particle diameters from the above sieved crude Ti particles as one type or a mixture of two or more types, and melting by using an electron beam.

Second method consists of a step of acid-treating the crude Ti particles to remove a contaminated layer on the crude Ti particle surfaces and a step of melting the acid-treated crude Ti particles by using an electron beam.

The highly purified Ti material having good processability and thermal conductivity of the present invention has been achieved by finding out the facts that the crude Ti particles prepared by molten salt electrolysis or Iodide method have different purities, and particularly oxygen contents depending on the particle diameter, that the impurities contained in the crude Ti particles exist as concentrated in the surface layer, and that a thermal conductivity of not less than 16 W/m K and a reduction of area of not less than 70%, as well as high purity, which heretofore could hardly be obtained by the prior arts can be obtained by using sieving and acid-treating methods.

The highly purified Ti material of the present invention can be prepared for example as follows.

First, crude Ti particles which make a starting material of the present invention are prepared by molten salt electrolysis for example. As the Ti material used for molten salt electrolysis, for example, sponge Ti, preferably one including less U and Th contents is used. KCl-NaCl is preferably used for electrolytic bathing (electrolyte), and an electrolytic temperature of 730° to 755° C. and a voltage of 6.0 to 8.0V are preferable. The Ti particles prepared by molten salt electrolysis usually has high contents of Na and K and relatively less heavy metals such as Fe and Ni or oxygen. The crude Ti particles as a starting material of the present invention are not limited to those prepared by molten salt electrolysis, but include those which can have a desired purity by melting with an electron beam (hereinafter called EB melting) to be mentioned below. For example, crystal Ti prepared by Iodide method or sponge Ti then acid-treated can be used.

In the present invention, the above crude Ti particles (for example, needle-shaped Ti particles) are subjected to at least one selected from the following two kinds of treatments. (1) The crude Ti particles are sieved with a nonmetallic sieve such as of nylon for preventing contamination from outside, to be classified based on each particle diameter (outer diameter of Ti particles and the same is applied hereinafter). (2) The crude Ti particles are acid-treated to remove a contaminated layer existing on the surface.

Impurities contained in the crude Ti particles prepared by molten salt electrolysis exist as concentrated on the surface layer. Therefore, the particle diameters are classified as in the above (1) to select needle-shaped Ti particles having bigger particle diameters, so that the specific surface area is decreased and the content of impurities is proportionally decreased. Selecting the particle diameters to be used decreases particularly oxygen content and at the same time provides the final product with a thermal conductivity of not less than 16 W/m K and a reduction area of not less than 70%.

Forcibly removing the surface contaminated layer as in the above (2) decreases the content of impurities and at the same time provides the final product with a thermal conductivity of not less than 16 W/m K and a reduction of area of not less than 70%. The acid treatment is advantageous for removing the contaminated layer, particularly heavy metals such as Fe, Ni and Cr.

The same is also applied to Ti particles prepared by Iodide method.

In the method of sieving as in the above (1), it is preferable to selectively use the Ti particles having a particle diameter of not less than 1 mm without many impurities, particularly those with a particle diameter of not less than 2 mm. The particle diameters of the crude Ti particles are not limited to not less than 1 mm, but Ti particles having smaller particle diameters can be used together within an allowable range of impurity contents in the Ti material of the present invention because the impurities are present in the Ti particles in proportion to the particle diameters. In this case, it is preferable to use not less than 90% of the crude Ti particles having a particle diameter of not less than 1 mm. Minute Ti particles having a particle diameter of not more than 0.5 mm are preferably not to be used because vacuum may be unstable during EB melting.

The acid treatment as in the above (2) is preferably operated by acid-treating in an inert atmosphere such as of argon gas, washing with purified water, and drying to prevent re-contamination of the surface layer (especially by oxygen). The acid solution to be used is, for example, hydrofluoric acid, hydrochloric acid, nitric acid, a mixture of hydrofluoric acid and hydrochloric acid, and a mixture of nitric acid and hydrochloric acid. To remove only the surface layer, a mixture of hydrochloric acid, fluoric acid and water in a ratio of 0.8 to 1.2:1.8 to 2.2:36 to 38 by volume is preferably used.

The content of impurities can be decreased by sieving according to the above-mentioned (1) to select the Ti particles having a greater particle diameter such as not less than 1 mm and treating them to remove their surface contaminated layers. Sieving after the acid treatment results in the same.

Thus, the impurities remaining in the crude Ti particles are further decreased by either one of the above-mentioned treatment (1) and (2), and Na and K are finally removed by EB melting. The EB melting can remove particularly Na and K effectively.

Generally, to effect the EB melting, the crude Ti particles may be compressed by press molding to be solidified and used as an electrode for EB melting. In this case, because re-contamination might be caused by tools or deformation when molded, the present invention preferably puts the crude Ti particles (needle-shaped Ti particles) as they are into a vibrating granulator in vacuum and EB-melts to prevent the re-contamination.

The crude Ti particles are EB-melted in an EB melting furnace which is controlled to an inside vacuum of $5\times10^{-5}$ mbar, preferably not more than $2\times10^{-5}$ mbar, preventing a diffusion pump oil from entering into the furnace by a freon baffle. Operating conditions of the EB melting are not particularly limited but are required to select a melting speed considering a degree of removing Na and K, and contamination by absorption of oxygen. For example, it is desirably 1.75 to 2.3 kg/hour.

In the above step, remarkably improved conductance of vacuum exhaust solves a disadvantage that the oxygen content increases when arc melting is employed. By sieving to remove minute particles, stable vacuum is attained at the low vacuum side in EB melting and the EB-casted material prepared has its oxygen content suppressed to not more than 350 ppm, and other impurities are to be decreased but not increased.

The Ti material prepared by the above-mentioned procedure has a high purity of an oxygen content of not more than 350 ppm, Fe, Ni, and Cr contents of not more than 15 ppm each, Na and K contents of not more than 0.5 ppm each and U and Th contents of not more than 1 ppb each, the high processability of a reduction of area as a material characteristic of not less than 70%, and a high thermal conductivity of not less than 16 W/m K. Besides, the Ti material prepared under different conditions selected has a high purity of an oxygen content of not more than 250 ppm, Fe, Ni, and Cr contents of not more than 10 ppm each and Na and K contents of not more than 0.1 ppm each, and a high processability of a reduction of area as a material characteristic of not less than 80%, and a high thermal conductivity of 17 W/m K. Additionally, the Ti material obtained satisfies a high purity of an oxygen content of not more than 200 ppm, Fe, Ni and Cr contents of not more than 5 ppm each and Na and K contents of not more than 0.05 ppm each, the high processability of a reduction of area as a material characteristic of not less than 85%, and the high thermal conductivity of not less than 18 W/m K.

To prepare the sputtering target of the present invention, first of all, the highly purified Ti material prepared by the above-mentioned method is cold-forged into a desirable form without re-contamination. The cold forging shall be operated in a cold condition (at about room temperature) while preventing re-contamination by absorbing gases considering the characteristics of the Ti material easily absorbing any gases. After that, the sputtering target of the present invention is prepared by shaping the cold-forged Ti material into a certain target form by machining.

The cold processability of the Ti material depends on the above-mentioned reduction of area. Because the Ti material having a reduction of area of not less than 70% can satisfy the cold processability in forming it into a sputtering target, the sputtering target not having heterogeneous part such as scratches and creases inside or on the surface of it can be formed to have a certain form. The reduction of area is preferably not less than 80%, particularly not less than 85%. Sputtering using the Ti target controls the irregular flight of sputtering particles caused by the heterogeneous part and provides a film having more uniform thickness and inside structure.

The above-mentioned reduction area shall have a value measured according to JIS Z 2241. With a specific measuring method, a sample is set in a tensile tester according to JIS B 7721 and pulled in an axial direction, and a reduction area $\Psi$ (%) is calculated form the area A of a fracture plane and the initial cross section A0 by the following formula (I).

$$\Psi = (A0 - A)/A0 \times 100 \quad \text{(I)}$$

Using the high thermal conductive Ti material having a thermal conductivity of not less than 16 W/m K as a sputtering target permits the thermal energy applied to the target during sputtering to be uniformly discharged to the side of a backing plate. The thermal conductivity is preferably not less than 17 W/m K, particularly not less than 18 W/m K. Because sputtering can be operated in a uniform heating condition in a whole target, more homogeneous film can be prepared.

The above-mentioned thermal conductivity is measured by Flash method. Specifically, the method consists of radiating a pulse light onto a sample surface uniformly by laser for instance, measuring the increased temperature on the back surface of the sample to obtain a thermal diffusivity $\alpha$, and calculating the thermal conductivity $\lambda$ from the thermal diffusivity $\alpha$ as follows:

$$\alpha = 1.3 L^2 / (\pi^2 \cdot t_{1/2}) \quad \text{(II)}$$

where,

L=a thickness of the sample, and
$t_{1/2}$=a time until the temperature on the back surface of the sample reaches a half of maximum, and $$\lambda = \alpha \cdot Cp \cdot \rho \quad \text{(III)}$$

where,
Cp=a specific heat capacity, and
$\rho$=a density of the sample.

The present invention provides a Ti material having a high purity, high processability and high thermal conductivity by an easy method. Using the Ti material as a target material for sputtering process permits high minute wiring on LSI or ULSI for instance and a film for barrier to be formed uniformly and good reproducibility, and suppresses the content of undesirable impurity elements to significantly small.

DETAILED DESCRIPTION OF THE PREFERRED EMBODIMENTS

Examples of the present invention will be described below.

EXAMPLE 1

An electrode made of sponge Ti was put into a KCl-NaCl electrolytic bath (KCl: 16% by weight, NaCl: 84% by weight) and molten-salt-electrolyzed at an electrolytic temperature of 755° C. with an electric current of 200A and a voltage of 8.0 V to prepare needle crude Ti particles.

The crude Ti particles obtained were sieved with a nylon sieve and classified into the following 5 types based on the particle diameters.

$t_1 < 0.5$ mm, $0.5$ mm $\leq t_2 < 1.0$ mm, $1.0$ mm $\leq t_3 < 1.5$ mm, $1.5$ mm $\leq t_4 < 2.0$ mm, $2.0$ mm $\leq t_5$ Oxygen content of each group of Ti particles classified based on each particle diameter was measured. The result is shown in FIG. 1.

Figure 1:
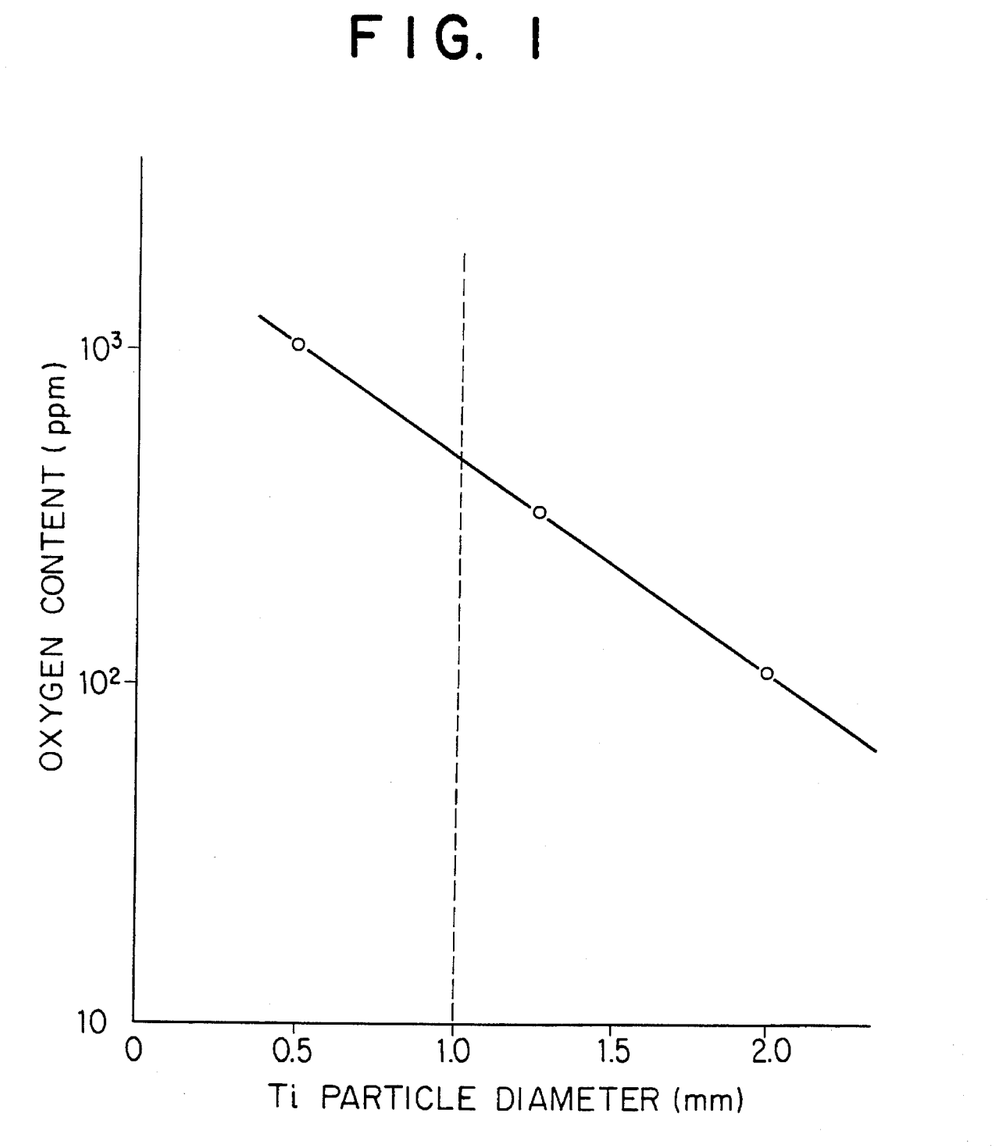
FIG. 1 is a graph showing the relationship between the particle diameter and the oxygen content of the crude Ti particles prepared by one embodiment of the present invention.

FIG. 1 shows that the Ti particles having smaller particle diameters have more oxygen content. Therefore, considering the oxygen content relating with the particle diameters for planning a starting material (for EB melting material) can control the oxygen content. Besides, selectively using Ti particles having a particle diameter of not less than 1 mm promises a Ti material having a smaller oxygen content.

The crude Ti particles classified based on each particle diameter were EB-melted. Table 1 shows the combination of the particles of the Ti particle diameters used as a starting material. These starting materials were respectively put into granulators, and the granulators were put into an EB melting furnace in a vacuum preventing re-contamination. The materials were EB-melted under conditions of a high vacuum of acteristics of the thickness of the Ti films were evaluated with reference to the distribution of the specific resistances. The results are shown in Table 1.

TABLE 1

| No | Ti Combination of particle diameters*1 (d: mm, % by weight) | Reduction of area (%) | Thermal conductivity (W/m K) | Oxygen content (ppm) | Processability*2 | Characteristic of thickness of sputtered film*3 |
|---|---|---|---|---|---|---|
| Example 1 | | | | | | |
| 1 | d = 1 mm, 100% | 79.5 | 16.85 | 350 | Δ | ○ |
| 2 | 1 ≦ d ≦ 1.5, 1 mm: 50%, 1.5 mm: 50% | 79.8 | 16.90 | 340 | ○ | ○ |
| 3 | d = 1.5 mm, 100% | 80.3 | 16.97 | 300 | ○ | ○ |
| 4 | 1 ≦ d ≦ 2, 1 mm: 50%, 2 mm: 50% | 80.7 | 17.00 | 230 | ○ | ○ |
| 5 | 1.5 ≦ d ≦ 2, 1.5 mm: 50%, 2 mm: 50% | 81.0 | 17.10 | 200 | ○ | ○ |
| 6 | d = 2 mm, 100% | 81.3 | 17.20 | 150 | ○ | ○ |
| 7 | 2 ≦ d ≦ 3, 2 mm: 50%, 3 mm: 50% | 81.5 | 17.30 | 130 | ○ | ○ |
| 8 | d = 3 mm, 100% | 83.0 | 17.50 | 110 | ○ | ○ |
| 9 | 3 ≦ d ≦ 4, 3 mm: 50%, 4 mm: 50% | 85.0 | 17.80 | 90 | ○ | ○ |
| 10 | d ≧ 4, 4 mm: 80%, bal: 20% | 89.0 | 18.50 | 60 | ○ | ○ |
| Comparative experiment 1 | | | | | | |
| 11 | 0.5 ≦ d ≦ 1, 0.5 mm = 50%, 1 mm = 50% | 79.0 | 16.80 | 360 | X | Δ |
| 12 | d ≦ 0.5 mm, 0.5 mm: 80%, bal: 20% | 56.7 | 16.00 | 950 | X | Δ |

*1: In the column showing the combination of the Ti particle diameters, each value (d) is a median with ± 0.1 mm. For example, "d = 2 mm, 100%" means 100% of Ti particles were left between 1.9-mm and 2.1-mm sieving. Also, "2 ≦ d < 3, 2 mm: 50%, 3 mm: 50%" means 50% of Ti particles were left between 1.9-mm and 2.1-mm sieving, and 50% of Ti particles between 2.9-mm and 3.1-mm sieving.
*2: ○ = surface and edges have no cracks, Δ = surface has some cracks, and X = cracks reaching inside.
*3: ○ = substantially no difference of the specific resistances between the center and edges of a sputtered film, and Δ = significant difference of the specific resistances between the center and edges of a sputtered film.

$1 \times 10^{-5}$ mbar in the furnace, preventing a diffusion pump oil from entering into the furnace by a freon baffle, a voltage of 20 kV, a filament current of 1.3 to 1.5 A, an EB output of 26 to 30 kW and a melting speed of 4 kg/hour. And ingots having a diameter of 135 mm were respectively prepared.

The Ti materials thus obtained were measured for the oxygen content, reduction of area, thermal conductivity and processability. The results are shown in Table 1. Comparative experiments in Table 1 were made EB melting using the Ti particles having small-diameter particles only and are given for comparison with the present invention.

The measurements were made according to the following methods.
(a) Reduction of area: A columnar sample having a diameter of 8 mm was prepared and set in a tensile tester according to JIS B 7721 and pulled in an axial direction. A reduction area Ψ (%) was calculated from the area A of a rapture cross-section and the initial cross section A0 according to the above-mentioned formula (I).
(b) Thermal conductivity: A thermal diffusivity α was measured with a thermal diffusivity measuring apparatus (TC-3000, manufactured by Shinku Rikosha) by laser flash method, and a thermal conductivity λ was calculated from the measurements according to the above-mentioned formula (III).
(c) Processability: A Ti material sample having a diameter of 135 mm and a thickness of 90 mm was cold-forged into a diameter of 280 mm and a thickness of 20 mm. It was then checked for cracks on the surface and crevices at the edges.

Furthermore, the above Ti ingots were respectively cold-forged and machine-ground into a certain form to prepare sputtering targets.

The Ti targets were subjected to puttering, and conditions were determined so that each Ti film having a thickness of 1000Å was formed on an Si substrate. The specific resistance of the Ti film obtained was measured, and the char- The results shown in Table 1 indicate that the Ti materials of the examples do not contain much oxygen, and have good processability and thermal conductivity. And the preparation of sputtering targets using such Ti materials provides sputtered films having very uniform thickness, and allows a reliable production of high minute wiring networks and films for barrier for LSI, VLSI and ULSI which are highly integrated to have 1 Mbit or 4 Mbits for instance.

The other impurities contained in the Ti materials of Example 1 were Fe, Ni and Cr of not more than 1.0 ppm each, and Na and K of not more than 0.05 ppm each.

EXAMPLE 2

As same as in Example 1, crude Ti particles prepared by molten salt electrolysis were classified into 5 types of particle diameters and each type of particles was treated to remove the surface layer with a mixture of hydrochloric acid and hydrofluoric acid. In this treatment, the mixture of acids were prepared from hydrochloric acid, hydrofluoric acid and water in a ratio of 1.0: 2.0: 37 by volume; each type of particles was washed with the above mixed acid in an argon atmosphere, further washed with purified water, and dried.

Figure 2:
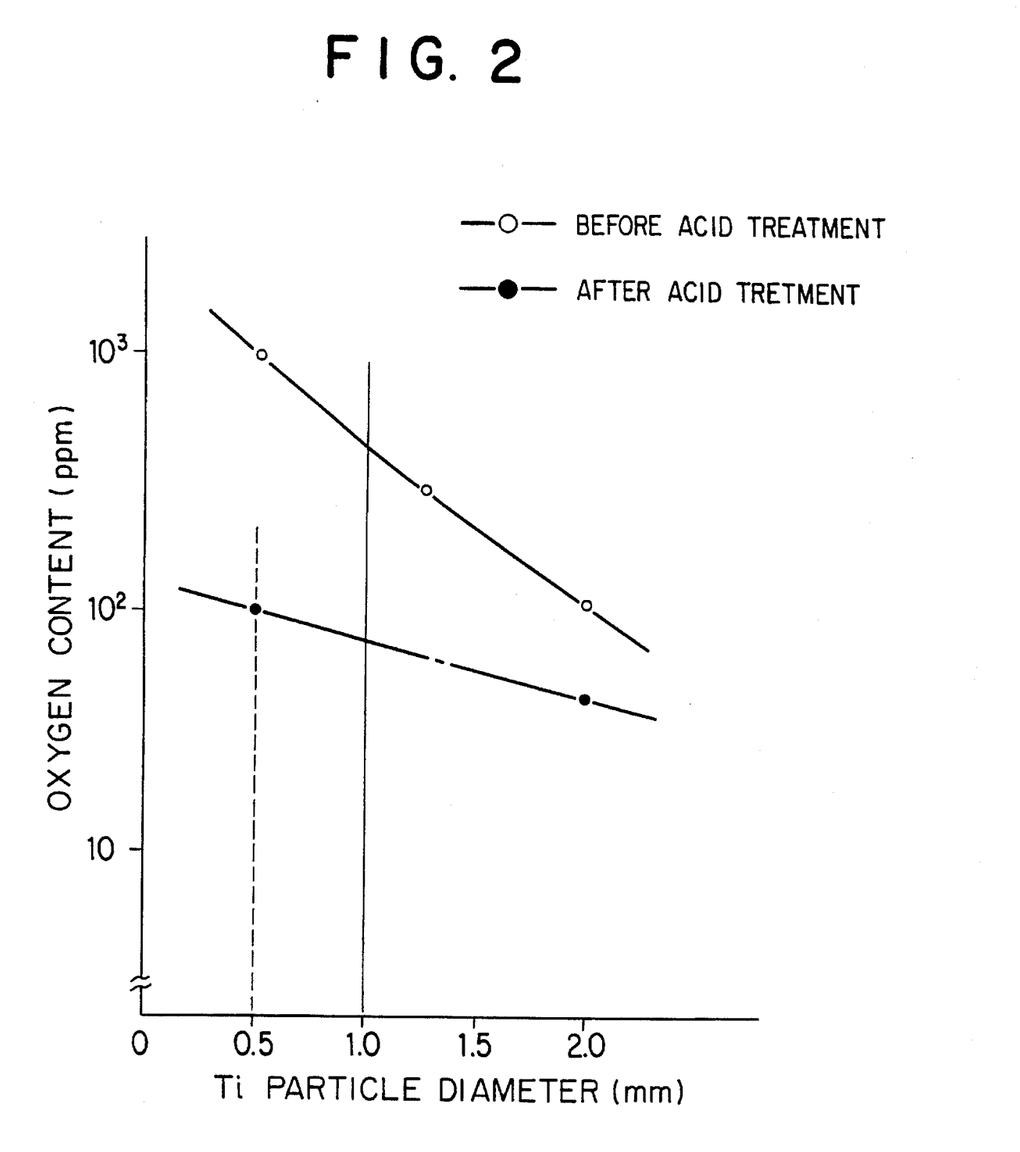
FIG. 2 and FIG. 3 are graphs each showing the relationship between the particle diameter and the oxygen content or the Fe content of the crude Ti particles prepared by one embodiment of the present invention.
Figure 3:
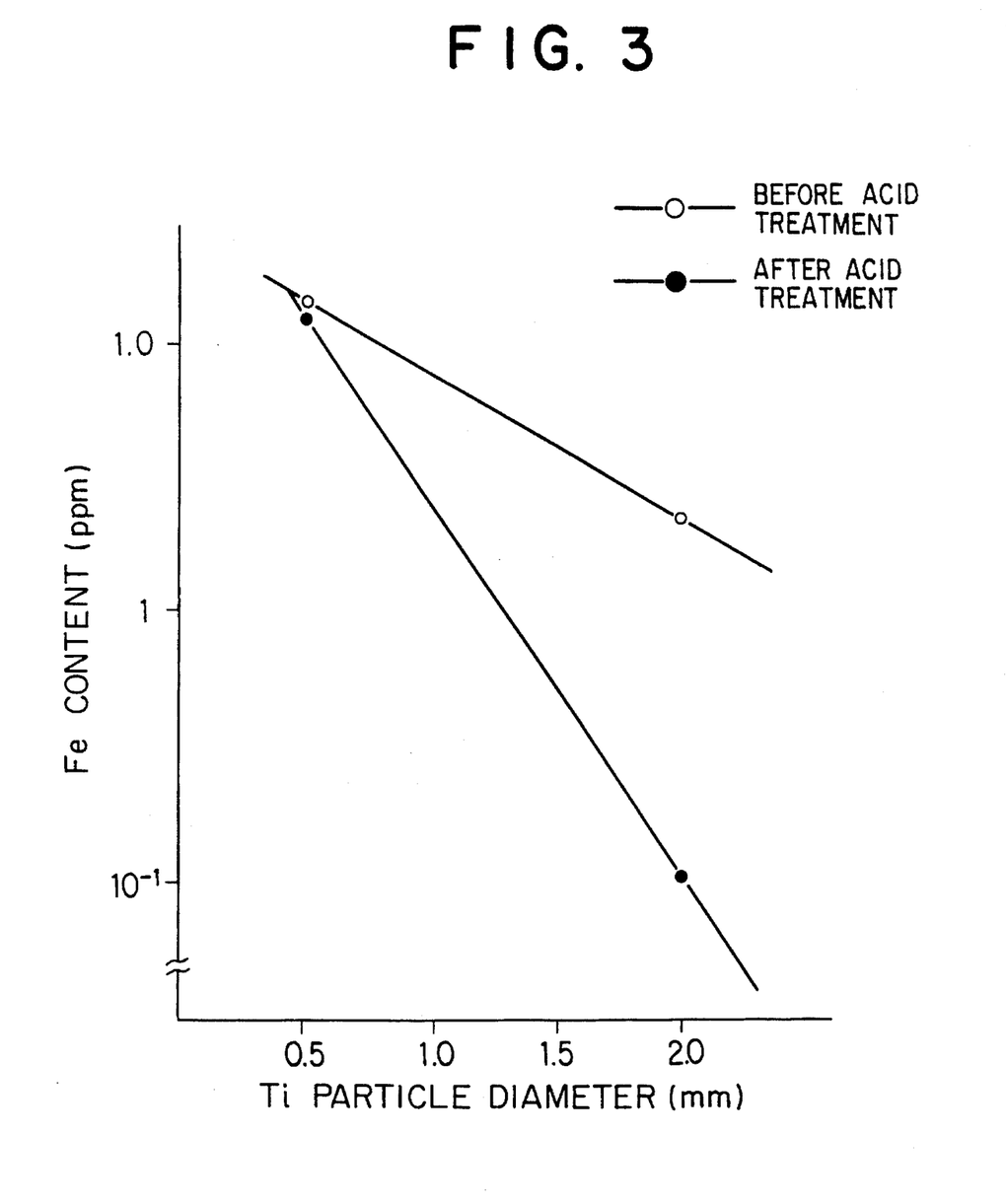

Each type of particles was measured for the oxygen content and Fe content before and after the acid treatment. The results are shown in FIG. 2 and FIG. 3.

It is clear from these figures that removing the surface layer having a thickness of about 300Å from the surface significantly decreases impurities, with the result that the Ti particles having a small particle diameter can be highly purified.

The crude Ti particles acid-treated depending on each type of particles were combined (shown in Table 2) and, as a starting material for EB melting, were subjected to EB melting in the same conditions as in Example 1 to prepare Ti ingots. They were measured for the oxygen contents, reductions of area, thermal conductivities and processabilities of the obtained Ti materials by the same method as in Example 1. The results are shown in Table 2. Besides, Ti targets were prepared from the above Ti materials in the same way as in Example 1 and also subjected to sputtering, and the characteristics of thickness of the films were evaluated. The results are shown in Table 2 together.

TABLE 2

| No | Ti Combination of particle diameters*1 (d: mm, % by weight) | Acid treatment | Reduction of area (%) | Thermal conductivity (W/m K) | Oxygen content (ppm) | Fe content (ppm) | Processability*2 | Characteristic of thickness of sputtered film*3 |
|---|---|---|---|---|---|---|---|---|
| Example 2 | | | | | | | | |
| 1 | d = 0.5 mm, 100% | yes | 83.5 | 17.6 | 100 | 12 | ○ | ○ |
| 2 | 0.5 ≦ d ≦ 1, 0.5 mm = 50%, 1 mm = 50% | " | 85 | 18.2 | 80 | 5 | ○ | ○ |
| 3 | d = 1.0 mm, 100% | " | 87 | 18.4 | 70 | 3 | ○ | ○ |
| 4 | 1 ≦ d ≦ 2, 1 mm: 50%, 2 mm: 50% | " | 89 | 18.5 | 62 | 0.5 | ○ | ○ |
| 5 | d = 2 mm, 100% | " | 92 | 18.6 | 40 | 0.1 | ○ | ○ |
| Comparative experiment 2 | | | | | | | | |
| 6 | d = 0.5, 100% | no | 55 | 16.3 | 1000 | 15 | X | Δ |
| 7 | 0.5 ≦ d ≦ 1, 0.5 mm = 50%, 1 mm = 50% | " | 61 | 16.5 | 600 | 10 | X | Δ |

The results shown in Table 2 indicate that each Ti material of Example 2 does not contain much oxygen and Fe and has good processability and thermal conductivity as same as in Example 1 by removing the surface layer of the crude Ti particles by molten salt electrolysis. And as same as in Example 1, it is possible to reliably produce high minute wiring networks and films for barrier on LSI, VLSI and ULSI which were highly integrated to have 1 Mbit or 4 Mbits for instance.

The other impurities contained in the Ti materials of Example 2 were Ni and Cr of respectively not more than 1 ppm, and Na and K of respectively not more than 0.05 ppm.

What is claimed is:

1. A method for preparation of highly purified Ti material having an oxygen content of not more than about 350 ppm, Fe, Ni and Cr contents of not more than about 15 ppm each, and Na and K contents of not more than about 0.5 ppm each, the method comprising the steps of:

preparing crude Ti particles by molten salt electrolysis, thermally reducing a Ti compound with an active metal or thermally decomposing titanium iodide, sieving said crude Ti particles to classify them depending on particle diameter;

selecting sieved crude Ti particles having a specific particle diameter range from the above classified crude Ti particles; and melting the sieved crude Ti particles by an electron beam wherein said specific particle diameter is selected large enough to provide crude Ti particles having a sufficiently low impurity content per unit mass to produce after said step of electron beam melting, a highly purified Ti material having an oxygen content of not more than about 350 ppm, Fe, Ni and Cr contents of not more than about 15 ppm each, and Na and K contents of not more than about 0.5 ppm each, wherein the crude Ti particles selectively used from the crude Ti particles classified depending on particle diameter are substantially free of particles having a diameter of less than about 0.5 mm.

2. The method for preparation of highly purified Ti material according to claim 1, wherein at least about 90% of the crude Ti particles selectively used from the crude Ti particles classified depending on particle diameter have a particle diameter of not less than about 1 mm.

3. The method for preparation of highly purified Ti material according to claim 2, wherein the crude Ti particles selectively used from the crude Ti particles classified depending on particle diameter have a particle diameter of not less than about 2 mm.

4. The method for preparation of highly purified Ti material according to claim 1, wherein said crude Ti particles are prepared by molten salt electrolysis.

5. The method for preparation of highly purified Ti material according to claim 1, wherein said step of electron beam melting is carried out at vacuum of not more than about $5 \times 10^{-5}$ mbar.

6. The method for preparation of highly purified Ti material according to claim 5, wherein said step of electron beam melting is carried out at vacuum of not more than about $2 \times 10^{-5}$ mbar.

7. The method for preparation of highly purified Ti material according to claim 1, wherein said desired particle diameter is selected large enough to provide crude Ti particles having a sufficiently low impurity content per unit mass to produce after said step of electron beam melting a highly purified Ti material having an oxygen content of not more than about 250 ppm, Fe, Ni and Cr contents of not more than about 10 ppm each, and Na and K contents of not more than about 0.1 ppm each.

8. The method for preparation of highly purified Ti material according to claim 7, wherein said desired particle diameter is selected large enough to provide crude Ti particles having a sufficiently low impurity content per unit mass to produce after said step of electron beam melting a highly purified Ti material having an oxygen content of not more than about 200 ppm, Fe, Ni and Cr contents of not more than about 5 ppm each, and Na and K contents of not more than about 0.05 ppm each.

9. A method for preparation of highly purified Ti material having an oxygen content of not more than about 350 ppm, Fe, Ni and Cr contents of not more than about 15 ppm each, and Na and K contents of not more than about 0.5 ppm each, comprising the steps of:

preparing crude Ti particles by molten salt electrolysis, thermally reducing a Ti compound with an active metal or thermally decomposing titanium iodide, acid treating said crude Ti particles to substantially completely remove an impurity-contaminated layer containing one or more of Fe, Ni and Cr existing on the surface of the crude Ti particles; and melting the acid-treated crude Ti particles by an electron beam, wherein said impurity-contaminated layer which is substantially, completely removed, is selected thick enough to provide crude Ti particles having a sufficiently low impurity content per unit mass to produce after said step of electron beam melting, a highly purified Ti material having an oxygen content of not more than about 350 ppm, Fe, Ni and Cr contents of not more than about 15 ppm each, and Na and K contents of not more than about 0.5 ppm each, wherein said acid-treatment step is carried out in an inert atmosphere using a mixture of hydrochloric acid, hydrofluoric acid and water in a ratio of from about 0.8 to 1.2: 1.8 to 2.2: 36 to 38 by volume, respectively.

10. The method for preparation of highly purified Ti material according to claim 9, wherein said step of electron beam melting is carried out at vacuum of not more than about $5 \times 10^{-5}$ mbar.

11. The method for preparation of highly purified Ti material according to claim 10, wherein said step of electron beam melting is carried out at vacuum of not more than about $2 \times 10^{-5}$ mbar.

12. The method for preparation of highly purified Ti material according to claim 9, further comprising the steps of sieving the crude Ti particles to classify them based on particle diameter, before the step of acid treatment or between the step of acid treatment and the step of electron beam melting, and selecting for said step of electron beam melting particles having a diameter of not less than about 0.5 mm.

13. The method for preparation of highly purified Ti material according to claim 12, wherein at least about 90% of the crude Ti particles selected from the crude Ti particles classified depending on particle diameter have a particle diameter of not less than about 1 mm.

14. The method for preparation of highly purified Ti material according to claim 13, wherein at least about 90% of the crude Ti particles selected from the crude Ti particles classified depending on particle diameter have a particle diameter of not less than about 2 mm.

15. The method for preparation of highly purified Ti material according to claim 9, wherein said removed impurity-contaminated surface layer has a thickness selected large enough to provide crude Ti particles having a sufficiently low impurity content per unit mass to produce after said step of electron beam melting a highly purified Ti material having an oxygen content of not more than about 250 ppm, Fe, Ni and Cr contents of not more than about 10 ppm each, and Na and K contents of not more than about 0.1 ppm each.

16. The method for preparation of highly purified Ti material according to claim 15, wherein said removed impurity-contaminated surface layer has a thickness selected large enough to provide crude Ti particles having a sufficiently low impurity content per unit mass to produce after said step of electron beam melting a highly purified Ti material having an oxygen content of not more than about 200 ppm, Fe, Ni and Cr contents of not more than about 5 ppm each, and Na and K contents of not more than about 0.05 ppm each.

17. The method for preparation of highly purified Ti material according to claim 9, wherein said crude Ti particles are prepared by molten salt electrolysis.

18. The method for preparation of highly purified Ti material according to claim 9, wherein the acid used in said acid treatment is sufficiently concentrated to permit said substantially complete removal of the layer containing the one or more of Fe, Ni and Cr.

19. A method for preparation of highly purified Ti material having an oxygen content of not more than about 350 ppm, Fe, Ni and Cr contents of not more than about 15 ppm each, and Na and K contents of not more than about 0.5 ppm each, the method comprising the steps of:

preparing crude Ti particles by molten salt electrolysis, thermally reducing a Ti compound with an active metal or thermally decomposing titanium iodide, selecting said crude Ti particles having a specific particle diameter; and melting the selected crude Ti particles by an electron beam, wherein said specific particle diameter is selected large enough to provide crude Ti particles having a sufficiently low impurity content per unit mass to produce after said step of electron beam melting, a highly purified Ti material having an oxygen content of not more than about 350 ppm, Fe, Ni and Cr contents of not more than about 15 ppm each, and Na and K contents of not more than about 0.5 ppm each.

20. A method for preparation of highly purified Ti material having an oxygen content of not more than about 250 ppm, Fe, Ni and Cr contents of not more than about 10 ppm each, and Na and K contents of not more than about 0.1 ppm each, the method comprising the steps of:

preparing crude Ti particles by molten salt electrolysis;

sieving said crude Ti particles to classify them depending on particle diameter;

selecting sieved crude Ti particles having a specific particle diameter from the above classified crude Ti particles; and melting the sieved crude Ti particles by an electron beam, wherein said specific diameter is selected large enough to provide crude Ti particles having a sufficiently low impurity content per unit mass to produce after said step of electron beam melting, a highly purified Ti material having an oxygen content of not more than about 250 ppm, Fe, Ni and Cr contents of not more than about 10 ppm each, and Na and K contents of not more than about 0.1 ppm each.

21. A method for preparation of highly purified Ti particles according to claim 20, wherein at least about 90% of the crude Ti particles selectively used from the crude Ti particles classified depending on particle diameter have a particle diameter of not less than about 2 mm.

22. The method for preparation of highly purified Ti material according to claim 21, wherein the crude Ti particles selectively used from the crude Ti particles classified depending on particle diameter are substantially free of particles having a diameter of less than about 0.5 mm.

23. The method for preparation of highly purified Ti material according to claim 20, wherein said step of electron beam melting is carried out at vacuum of not more than about $5 \times 10^{-5}$ mbar.

24. The method for preparation of highly purified Ti material according to claim 20, wherein said desired particle diameter is selected large enough to provide crude Ti particles having a sufficiently low impurity content per unit mass to produce after said step of electron beam melting a highly purified Ti material having an oxygen content of not more than about 200 ppm, Fe, Ni and Cr contents of not more than about 5 ppm each, and Na and K contents of not more than about 0.05 ppm each.

25. A method for preparation of highly purified Ti material having an oxygen content of not more than about 250 ppm, Fe, Ni and Cr contents of not more than about 10 ppm each, and Na and K contents of not more than about 0.1 ppm each, comprising the steps of:

preparing crude Ti particles by molten salt electrolysis;

acid treating said crude Ti particles to remove an impurity-contaminated layer existing on the surface of the crude Ti particles; and melting the acid-treated crude Ti particles by an electron beam, wherein said impurity-contaminated layer removed is selected thick enough to provide crude Ti particles having a sufficiently low impurity content per unit mass to produce after said step of electron beam melting, a highly purified Ti material having an oxygen content of not more than about 250 ppm, Fe, Ni and Cr contents of not more than about 10 ppm each, and Na and K contents of not more than about 0.1 ppm each.

26. The method for preparation of highly purified Ti material according to claim 25, wherein said acid-treatment step is carried out in an inert atmosphere using an acid solution selected from hydrofluoric acid, hydrochloric acid and mixtures thereof.

27. The method for preparation of highly purified Ti material according to claim 26, wherein the acid solution comprises a mixture of hydrofluoric acid and hydrochloric acid.

28. The method for preparation of highly purified Ti material according to claim 27, wherein said acid-treatment step is carried out using a mixture of hydrochloric acid hydrofluoric acid and water in a ratio of from about 0.8 to 1.2: 1.8 to 2.2: 36 to 38 by volume respectively.

29. A method for preparation of highly purified Ti material having an oxygen content of not more than about 350 ppm, Fe, Ni and Cr contents of not more than about 15 ppm each, and Na and K contents of not more than 0.5 ppm each, the method comprising the steps of:

preparing crude Ti particles by molten salt electrolysis, thermally reducing a Ti compound with an active metal or thermally decomposing titanium iodide, acid treating said crude Ti particles to substantially completely remove an impurity-contaminated layer containing one or more of Fe, Ni and Cr existing on the surface of the crude Ti particles; and melting the acid-treated crude Ti particles by an electron beam, wherein said impurity-contaminated layer which is substantially, completely removed, is selected thick enough to provide crude Ti particles having a sufficiently low impurity content per unit mass to produce after said step of electron beam melting, a highly purified Ti material having an oxygen content of not more than about 350 ppm, Fe, Ni and Cr contents of not more than about 15 ppm each, and Na and K contents of not more than 0.5 ppm each, wherein said acid-treatment step is carried out in an inert atmosphere using an acid solution comprising a mixture of hydrofluoric acid and hydrochloric acid.

30. The method for preparation highly purified Ti material according to claim 29, wherein said acid treatment step is carried out in an inert atmosphere using a mixture of hydrochloric acid, hydrofluoric acid and water in a ratio of from about 0.8 to 1.2: 1.8 to 2.2: 36 to 38 by volume respectively.

* * * * *